United States Patent
Ngo et al.

(10) Patent No.: US 6,525,428 B1
(45) Date of Patent: Feb. 25, 2003

(54) GRADED LOW-K MIDDLE-ETCH STOP LAYER FOR DUAL-INLAID PATTERNING

(75) Inventors: Minh Van Ngo, Fremont, CA (US); Steven C. Avanzino, Cupertino, CA (US); Christy Mei-Chu Woo, Cupertino, CA (US); John E. Sanchez, Palo Alto, CA (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/183,458

(22) Filed: Jun. 28, 2002

(51) Int. Cl.$^7$ ...................... H01L 23/48; H01L 21/4763
(52) U.S. Cl. ...................... 257/774; 257/751; 257/758; 257/762; 438/640; 438/673; 438/687; 438/931
(58) Field of Search ................................ 257/774–775, 257/77, 750–753, 758–760, 762–763; 438/635–640, 629, 633, 667–668, 672–673, 675, 700–701, 713, 978, 931, 687

(56) References Cited

U.S. PATENT DOCUMENTS 6,303,523 B2 * 10/2001 Cheung et al. ............ 438/780
6,362,091 B1 * 3/2002 Andideh et al. ............ 438/624
6,383,913 B1 * 5/2002 Tsai et al. .................. 438/624
6,410,437 B1 * 6/2002 Flanner et al. ............. 438/689
6,429,122 B2 * 8/2002 Chooi et al. ............... 438/637
6,440,838 B1 * 8/2002 Lui et al. ................... 438/618

* cited by examiner

*Primary Examiner*—Carl Whitehead, Jr.
*Assistant Examiner*—Thanh Nguyen

(57) ABSTRACT

Improved etch selectivity, barrier metal wetting and reduced interconnect capacitance are achieved by implementing damascene processing employing a graded middle etch stop layer comprising a first silicon carbide layer, a silicon-rich layer on the first silicon carbide, and a second silicon carbide layer on the silicon-rich layer. Embodiments include sequentially depositing a porous low-k dielectric layer over a lower capped Cu line, depositing the graded middle-etch stop layer, depositing a porous low-k dielectric layer on the graded middle-etch stop layer, forming a dual damascene opening exposing the silicon-rich surface at the bottom of the trench opening, depositing a seed layer, depositing a barrier middle layer, such as Ta or a Ta/TaN composite, and filling the opening with Cu.

17 Claims, 3 Drawing Sheets

GRADED LOW-K MIDDLE-ETCH STOP LAYER FOR DUAL-INLAID PATTERNING

TECHNICAL FIELD

The present invention relates to semiconductor devices exhibiting reduced capacitance loading and to enabling methodology. The present invention has particular applicability in fabricating high density, multi-level semiconductor devices comprising sub-micron dimensions and exhibiting high circuit speed.

BACKGROUND ART

Interconnection technology is constantly challenged to satisfy the ever increasing requirements for high density and performance associated with ultra large scale integration semiconductor devices. The speed of semiconductor circuitry varies inversely with the resistance (R) and capacitance (C) of the interconnection system. The higher the value of the R×C product, the more limiting the circuit speed. As integrated circuits become more complex and feature sizes and spacings become smaller, the integrated circuit speed becomes less dependent upon the transistor itself and more dependent upon the interconnection pattern. Thus, the performance of multi-level interconnects is dominated by interconnect capacitance at deep sub-micron regimes, e.g., less than about 0.12 micron. The rejection rate due to integrated circuits speed delays in sub-micron regimes has become a limiting production factor.

The dielectric constant of materials currently employed in fabricating semiconductor devices for an interlayer dielectric (ILD) ranges from about 3.9 for dense silicon dioxide to over 8 for deposited silicon nitride. The value of the dielectric constant expressed herein is based upon a value of one (1) for a vacuum. In an effort to reduce interconnect capacitance, dielectric materials with lower values of permitivity have been explored. The expression "low-k" material has evolved to characterize materials with a dielectric constant less than about 3.9. One type of low-k material that has been explored are a group of flowable oxides which are basically ceramic polymers, such as hydrogen silsesquioxane (HSQ). There are several organic low-k materials, typically having a dielectric constant of about 2.0 to about 3.8, which may offer promise for use as an ILD. Organic low-k materials which offer promise are carbon-containing dielectric materials such as FLARE 20™ dielectric, a poly (arylene) ether, available from Allied Signal, Advanced Micromechanic Materials, Sunnvale, Calif., Black-Diamond™ dielectric available from Applied Materials, Santa Clara, Calif., BCB (divinylsiloxane bis-benzocyclobutene) and Silk™ dielectric, an organic polymer similar to BCB, both available from Dow Chemical Co., Midland, Mich. Other examples include porous, low density materials in which a significant fraction of the bulk volume contains air. The properties of these porous materials are proportional to their porosity, i.e., the greater the porosity, the less the dielectric constant.

Copper (Cu) and Cu alloys have received considerable attention as alternative metallurgy to aluminum (Al) in interconnect metallizations. Cu is relatively inexpensive, easy to process, and has a lower resistively than Al. In addition, Cu has improved electrical properties vis-à-vis tungsten (W), making Cu a desirable metal for use as a conductive plug as well as conductive wiring. However, due to Cu diffusion through dielectric materials, such as silicon dioxide, Cu interconnect structures must be encapsulated by a diffusion barrier layer. Typical diffusion barrier materials include tantalum (Ta), tantalum nitride (TaN), titanium (Ti), titanium nitride (TiN), tintanium-tungsten (TiW), Tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the ILD, but includes interfaces with other metals as well.

Cu interconnect technology, by and large, has been implemented employing damascene techniques, wherein an ILD, such as a silicon oxide layer, e.g., derived from tetraethyl orthosilicate (TEOS) or silane, or a low-k material, is formed over an underlying metal level containing metal features, e.g., Cu or Cu alloy features with a silicon nitride capping layer. A damascene opening, e.g., via hole, trench, or dual damascene opening, is then formed in the ILD. A barrier layer and optional seedlayer are then deposited, followed by Cu deposition, as by electrodeposition or electroless deposition.

In attempting to implement Cu interconnects with low-k dielectric materials, such as porous low-k dielectric materials, several problems have been encountered. For example, in implementing dual damascene techniques, a silicon nitride middle-etch stop layer is employed. However, silicon nitride typically has a dielectric constant (k) of about 8.0 which is antithetic to the continuing drive for reduced capacitance. In addition, the etch stopping ability of silicon silicide is less than optimum An improvement in the etch selectivity of the middle-etch stop layer would increase manufacturing throughput and device reliability. In addition, it was found that the barrier layers typically deposited prior to Cu deposition exhibit poor wetting properties.

There exists a need for efficient methodology enabling the use of low-k dielectric materials, in fabricating high density, multi-level interconnection patterns based on Cu. There exists a particular need for such methodology enabling interconnect fabrication with reduced capacitance, improved middle-etch stop selectivity and improved barrier layer adhesion.

DISCLOSURE OF THE INVENTION

An advantage of the present invention is a semiconductor device having interconnect patterns exhibiting reduced parasitic R×C time delays employing dielectric materials having a low dielectric constant.

Another advantage of the present invention is a method of manufacturing a semiconductor device having interconnect patterns exhibiting reduced parasitic R×C time delays employing dielectric materials having a low dielectric constant with improved middle-etch stop selectivity and improved barrier layer adhesion.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a first dielectric layer over a conductive feature formed over a wafer; forming a graded middle-etch stop layer on the first dielectric layer, the graded middle-etch stop layer comprising: a first silicon carbide layer on the first dielectric layer; a silicon layer on the first silicon carbide layer; and a second silicon carbide layer on the silicon layer; forming a second dielectric layer on the graded middle-etch stop layer; forming a dual damascene opening comprising: an upper trench section in the second dielectric layer exposing the silicon layer at the bottom of the trench section; and a lower via hole section in the first dielectric layer exposing an upper surface of the conductive features; and filling the dual damascene opening with conductive material.

Another aspect of the present invention is a semiconductor device comprising: a first dielectric layer over a conductive feature; a graded middle-etch stop layer on the first dielectric layer, the graded middle-etch stop layer comprising: a first silicon carbide layer on the first dielectric layer; a silicon layer on the first silicon carbide layer; a second silicon carbide layer on the silicon layer; a second dielectric layer on the graded middle-etch stop layer; a dual damascene opening comprising: an upper trench section having side surfaces defined by the second dielectric layer and a bottom surface defined by the silicon layer; and a lower via hole section having side surfaces defined by the first dielectric layer and a bottom surface defined by an upper surface of the conductive feature; and conductive material filling the dual damascene opening.

Embodiments of the present invention comprise employing low-k dielectric materials, such as porous low-k dielectric materials as the first and second dielectric layers, and depositing the graded middle-etch stop layer by PECVD at a temperature of 300° C. to 400° C. Embodiments include depositing the first silicon carbide layer, employing TMS, He and $NH_3$, at a thickness of 250 Å to 350 Å, depositing the silicon layer on the first silicon carbide layer by PECVD employing $SiH_4$, at a thickness of 20 Å to 50 Å and then depositing the second silicon carbide layer by PECVD employing TMS, He and $NH_3$, at a thickness of 250 Å to 350 Å. Embodiments of the present invention further include depositing a barrier layer, such as titanium or a composite comprising a layer of tantalum nitride with a layer of alpha-tantalum thereon. A seedlayer may then be deposited followed by filling the opening, as by electrodeposition or electrodeless deposition, with Cu. Chemical mechanical polishing (CMP) is then conducted to form a planarized upper surface, followed by deposition of a capping layer, such as silicon carbide or silicon nitride.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded and illustrative in nature, and not as restrictive.

BRIEF DESCRIPTION OF THE DRAWINGS

In FIGS. 1 through 3, similar features are devoted by similar reference characters.

DESCRIPTION OF THE INVENTION

Figure 1:
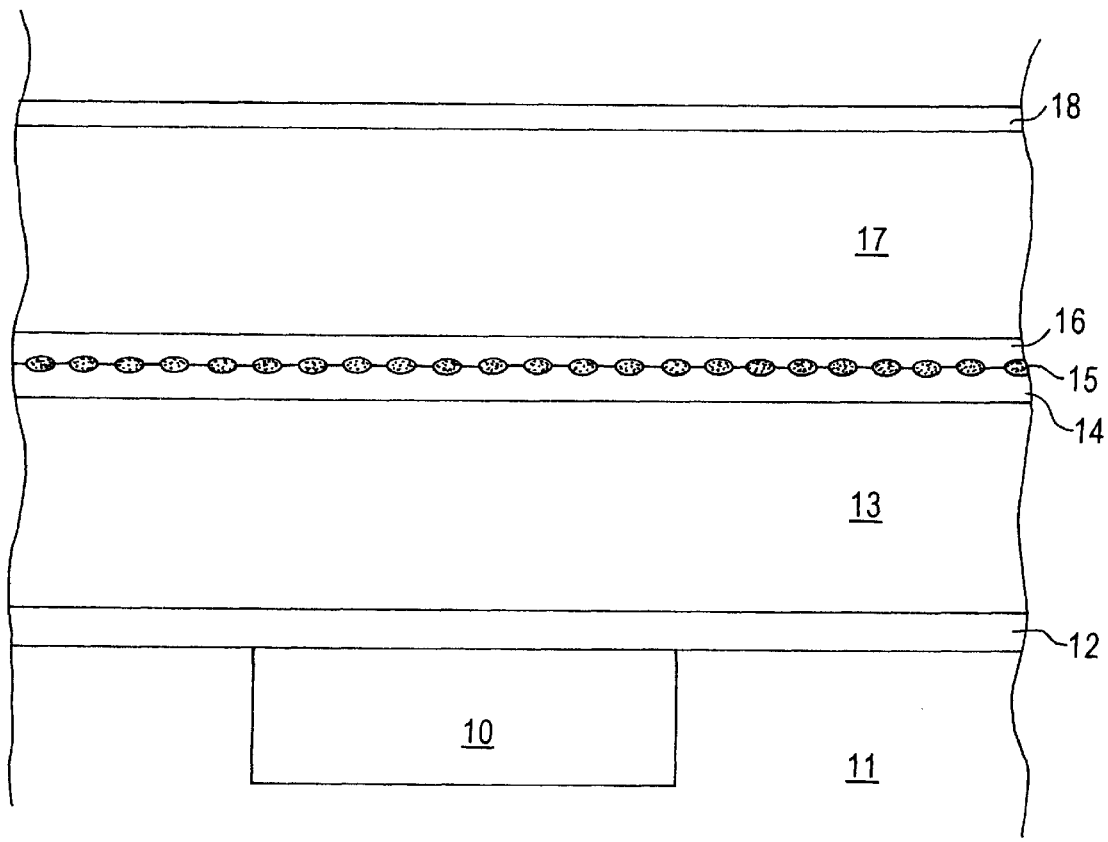
FIGS. 1 through 3 schematically illustrate sequential phases of a method in accordance with an embodiment of the present invention.

The present invention addresses and solves problems attendant upon fabricating multi-layer interconnect devices, particularly parasitic R×C time delay problems. The capacitance, both layer-to-layer and within-layer, is primarily attributed to the film properties of the ILD. The present invention enables efficient implementation of multi-level interconnect technology using various low-k dielectric materials for ILDs, such as porous low-k dielectric materials, by efficient damascene technology employing a strategically structured graded middle-etch stop layer having a relatively low dielectric constant, e.g., 4.5 to 5.5, which also exhibits superior etch selectivity with respect to the dielectric materials and also enhances adhesion of barrier metal layers, particularly barrier metal layers employed Cu damascene technology. As employed throughout this disclosure, the symbol Cu is intended to encompass high purity elemental copper as well as copper-based alloys, such as copper alloys containing minor amounts of tantalum indium, tin, zinc, manganese, titanium, germanium, ziconium, strontium, palladium, magnesium, chromium and tantalum.

In accordance with embodiments of the present invention, a graded middle-etch stop layer is formed between two low-k dielectric layers prior to forming a dual damascene opening. The graded middle-etch stop layer comprises a first silicon carbide layer, as at a thickness of about 250 Å to 350 Å, e.g. 300 Å, a layer of silicon or silicon-rich layer on the first silicon carbide layer, such as at a thickness of about 20 Å to 50 Å, and second silicon carbide layer, as at a thickness of about 250 Å to 350 Å, e.g., 300 Å, on the silicon or silicon-rich layer. A dual damascene opening is then formed by conventional techniques and comprises an upper trench section in communication with a lower via hole section. During etching of the trench, the upper or second silicon carbide layer is removed thereby exposing the silicon or silicon-rich layer at the bottom of the trench. Advantageously, the graded middle-etch stop layer has the dielectric constant of about 4.5 to 5.5 vis-à-vis conventional silicon nitride which has a dielectric constant of 8.0, thereby reducing interconnect capacitance. Further, the graded middle-etch stop layer has superior etch selectivity, thereby improving dimensional accuracy and uniformity. In addition, the exposed silicon or silicon-rich layer at the bottom of the trench significantly improves the barrier metal layer adhesion.

In accordance with the embodiments of the present invention, a wafer on which the damascene opening is formed is placed into a chamber of a conventional PECVD apparatus, such as an AMAT Producer, manufactured by Applied Materials, Inc. of Santa Clara, Calif. Initially, trimethyl silane (TMS) and helium (He) are introduced into the chamber. The TMS flow rate is stabilized at about 100 to about 200 sccm, and the He flow rate is stabilized at about 100 to about 1,000 sccm.

It was found particularly advantageous to delay the introduction of ammonia ($NH_3$), to avoid damaging the low-k dielectric materials at the beginning of the deposition cycle. It was found that a delay of about 5 to about 35 seconds, e.g., about 20 seconds, is sufficient to stabilize the flow rates of TMS and He and prevent degradation prior to introducing $NH_3$ into the chamber.

The RF power is then turned on, at about 240 to about 360 watts, e.g., about 300 watts, and $NH_3$ is introduced into the chamber and stabilized at a flow rate of about 200 to about 600 sccm. The pressure is typically maintained at about 2 to about 4 Torr, while the temperature is typically maintained at about 300° C. to about 400° C. Plasma enhanced chemical vapor deposition (PECVD) is conducted to deposit the first silicon carbide layer, as at a thickness of about 300 Å. The introduction of all gases is then discontinued, and the RF power is reduced to about 120 to 180 watts, e.g., about 150 watts. At this point, silane (SiH$_4$) is introduced and stabilized at a flow rate of about 50 to about 200 sccm, to deposit a uniform, thin silicon layer of about 20 Å to about 50 Å. Subsequently, the introduction of SiH$_4$ is discontinued, TMS, He and NH$_3$ introduced to and the RF power increased to about 240 to about 300 watts, e.g., 300 watts, to deposit the second silicon carbide layer under substantially the same conditions employed during PECVD of the first silicon carbide layer, as at a thickness of 250 Å to 350 Å; e.g., 300 Å. For example, the second silicon carbide layer may be deposited at a TMS flow rate of 100 to 200 sccm, He flow rate of 100 to 1,000 sccm and NH$_3$ flow rate of 200 to 600 sccm at a pressure of 2 to 4 Torr, maintaining the temperature at 300° C. to 400° C.

Low-k dielectric materials suitable for use in the present invention may comprise any of various low-k dielectric materials, particularly porous low-k materials, typically having a porosity of about 10% to about 20%. A wide variety of low-k materials can be employed as an ILD in accordance with embodiments of the present invention, including various polyimides, BCB, FLARE™, Silk™, and Black-Diamond™ dielectrics. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene, polypropylene and SiCOH which exhibits a dielectric constant of about 3 and contains SiC, SiH, CH and SiOH bonding. Other suitable low-k dielectric materials include fluorosilicate glass (FSG or SiOF), hydrogenated diamond-like carbon (DLC), polystyrene, fluorinated polyimides, parylene (AF-4), polyarylene ether, and polytatrafluoro ethylene. The present invention advantageously enables the use of porous low-k dielectric materials, such as siloxanes, silsesquioxanes, aerogels, and xerogels, typically having a porosity of about 10 to about 20%, without degradation during barrier metal layer deposition.

Figure 2:
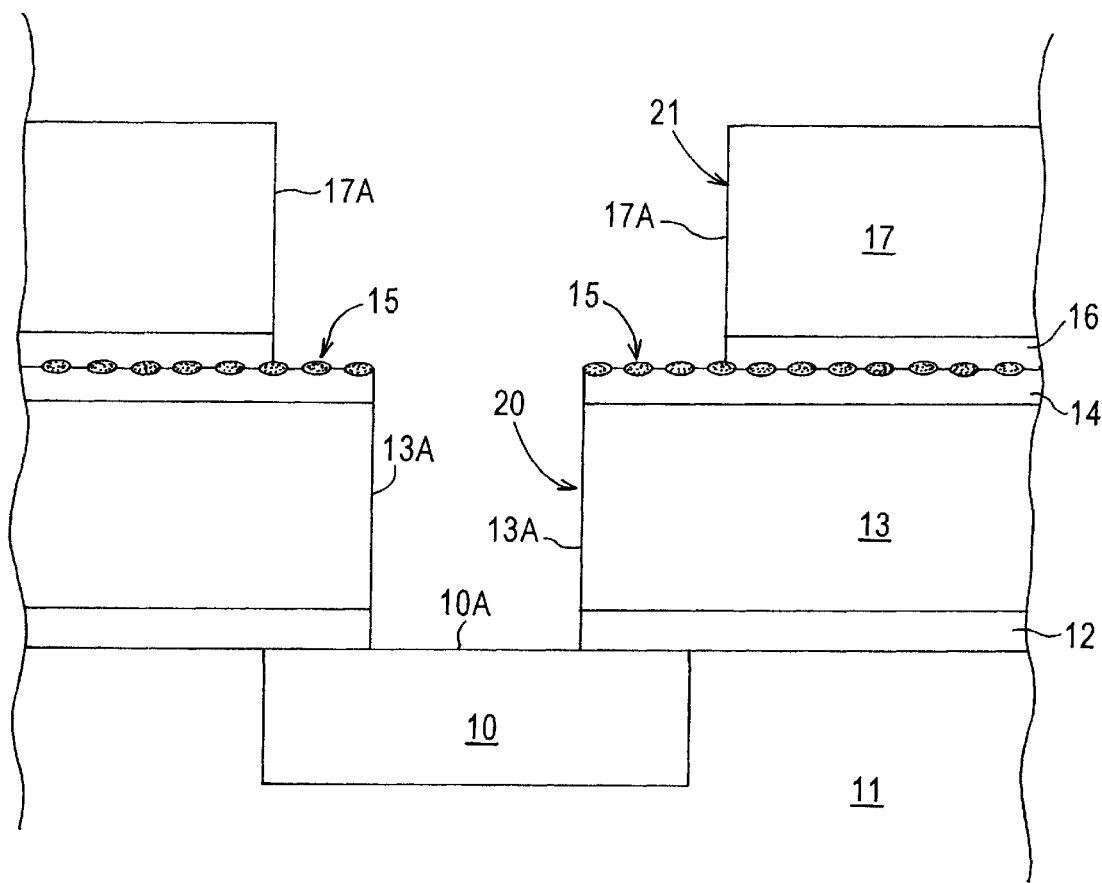
Figure 3:
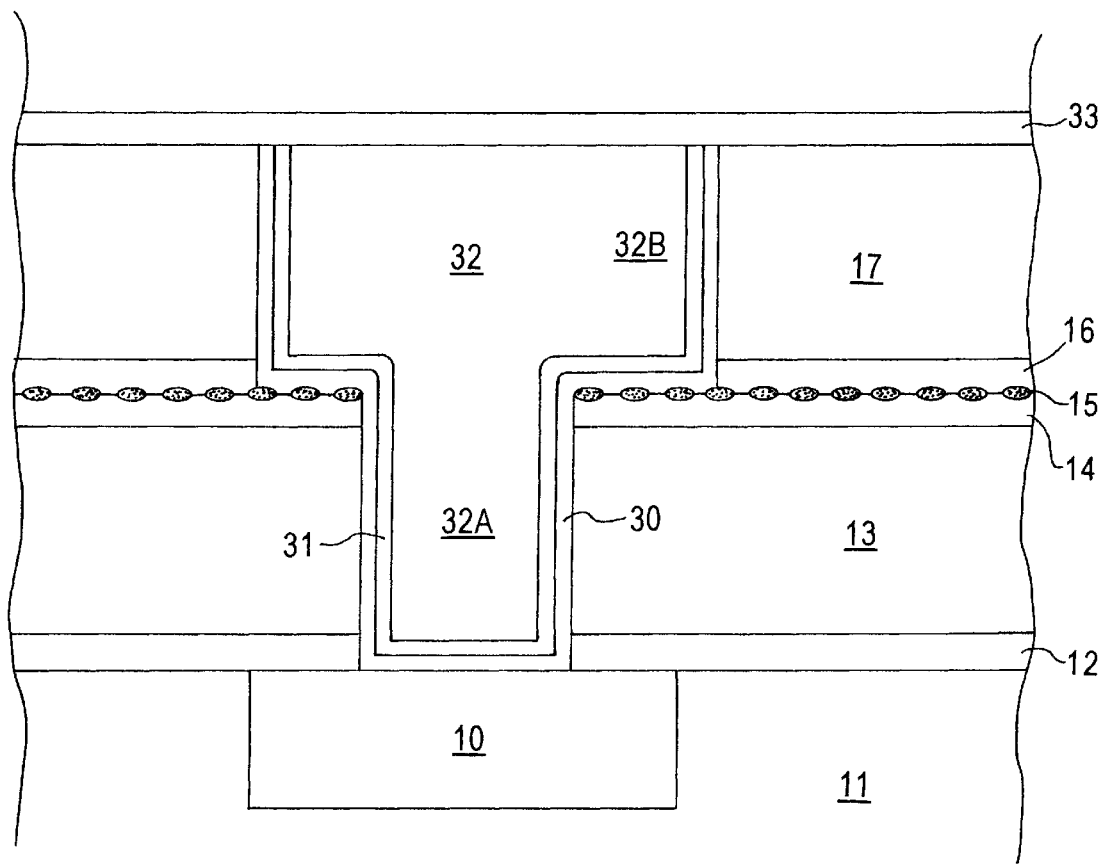

A method in accordance with an embodiment of the present invention is schematically illustrated in FIGS. 1 through 3, wherein like features are denoted by like reference characters. Adverting to FIG. 1, reference numeral 10 denotes a lower metal feature formed in interlayer dielectric (ILD) 11 overlying a substrate of a wafer (not shown). ILD 11 may comprise any conventional dielectric material, such as a low-k dielectric material. Lower conductive feature 10, may be a Cu line.

With continued reference to FIG. 1, a capping layer 12, such as silicon carbide, is formed over ILD 11 and Cu line 10. First 13 and second 17 low-k dielectric layers are formed with a graded middle etch stop layer therebetween. The graded middle-etch stop layer formed on ILD 13 comprises a first silicon carbide layer 14, as at a thickness of 300 Å, a silicon or silicon-rich layer 15, as at a thickness of 20 Å to 50 Å, and second silicon carbide layer 16 as at a thickness of 300 Å. A protective layer 18 is formed on dielectric layer 17, to prevent degradation of dielectric layer 17 during damascene processing. Dielectric layer 18 may be silicon carbide, silicon nitride or silicon oxynitride.

A dual damascene opening is then formed as illustrated in FIG. 2, comprising an upper trench section 21 in communication with a lower via section 20. The upper trench section is defined side surfaces 17A of dielectric layer 17 and a bottom defined by the exposed silicon layer 15 remaining after etching the trench during which the exposed portion of second silicon carbide layer 16 is removed. The lower via hole section 20 is defined by side surfaces 13A of dielectric layer 13 and a portion of the upper surface 10A of lower conductive feature 10.

The strategic use of a graded or composite middle-etch stop layer provides superior etch stopping capability, thereby enhancing dimensional accuracy, improving device reliability and improving uniformity. In addition, the graded middle-etch stop layer exhibits a lower dielectric constant than silicon nitride and, hence, functions to reduce overall interconnect capacitance, thereby increasing circuit speed. Further, the exposed silicon 15 at the bottom of the trench section enhances adhesion of a subsequently deposited barrier layer typically employed in Cu damascene processing.

Subsequently, as schematically illustrated in FIG. 3, a barrier layer 30, such as tantalum or a composite comprising a layer of tantalum nitride and a layer of α-Ta thereon, is deposited. A seedlayer 31 may then be deposited. Typical seedlayers include Cu alloys containing magnesium, aluminum, zinc, zirconium, tin, nickel, pallandium, silver or gold in a suitable amount, e.g., about 0.3 to about 12 at. %.

Cu is then deposited, as by electrodeposition or electroless deposition, followed by CMP to remove an overburden. A capping layer 33, such as silicon carbide or silicon nitride, is then deposited resulting in the structure schematically illustrated in FIG. 3, with Cu interconnect 32 comprising Cu line 32B and via 32A. Advantageously, the graded middle-etch stop layer also prevents degradation of the low-k dielectric layer 13, during damascene processing and enhances metal barrier layer adhesion.

The present invention enables fabricating semiconductor devices having multi-level interconnect patterns, interconnects based upon Cu and low-k dielectric materials, e.g., porous low-k dielectric materials, without degradation thereof during damascene processing with improved dimensional accuracy, improved reliability, reduced capacitance, increased operating speed and increased within wafer and wafer-to-wafer uniformity by strategically forming a graded silicon carbide middle-etch stop layer.

The present invention enjoys industrial applicability in fabricating highly integrated semiconductor devices exhibiting increased circuit speed. The present invention enjoys particular applicability in fabricating semiconductor devices with sub-micron dimensions, e.g., with a design rule of about 0.12 microns and under.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

forming a first dielectric layer over a conductive feature formed over a wafer;

forming a graded middle-etch stop layer on the first dielectric layer, the graded middle-etch stop layer comprising:

a first silicon carbide layer on the first dielectric layer;

a silicon layer on the first silicon carbide layer; and a second silicon carbide layer on the silicon layer;

forming a second dielectric layer on the graded middle-etch stop layer;

forming a dual damascene opening comprising:
   an upper trench section in the second dielectric layer exposing the silicon layer at the bottom of the trench opening; and
   a lower via hole section in the first dielectric layer exposing an upper surface of the conductive feature; and filling the dual damascene opening with conductive material.

2. The method according to claim 1, comprising forming the graded middle-etch stop layer by:
   depositing the first silicon carbide layer at a thickness of about 250 Å to 350 Å;
   depositing the silicon layer at a thickness of 20 Å to 50 Å; and
   depositing the second silicon carbide layer at a thickness of 250 Å to 350 Å.

3. The method according to claim 1, comprising forming the graded middle-etch stop layer by sequentially:
   introducing the wafer into a chamber;
   introducing trimethyl silane (TMS) and helium (He) into the chamber for a period of time sufficient to stabilize the TMS flow rate at 100 to 200 sccm and to stabilize the He flow rate at 100 to 1,000 sccm;
   introducing ammonia ($NH_3$) into the chamber to establish a stabilized flow rate of 200 to 600 sccm;
   applying an RF power of 240 to 360 watts to initiate plasma enhanced chemical vapor deposition (PECVD) of the first silicon carbide layer;
   discontinuing the introduction of TMS, He and $NH_3$ into the chambers;
   reducing the RF power to 120 to 180 watts;
   introducing silane ($SiH_4$) into the chamber to deposit the silicon layer on the first silicon carbide layer;
   discontinuing the introduction of $SiH_4$;
   introducing TMS, $NH_3$ and He into the chamber; and
   applying an RF power of 240 to 360 watts and depositing the second silicon carbide layer.

4. The method according to claim 3, comprising introducing the TMS and He into the chamber for about 5 to about 35 seconds to stabilize the TMS and He flow rates before introducing $NH_3$ into the chamber.

5. The method according to claim 3, comprising:
   depositing the first and second silicon carbide layers at a thickness of 250 Å to 350 Å; and
   depositing the silicon layer at a thickness of 20 Å to 50 Å.

6. The method according to claim 3, comprising introducing $SiH_4$ into the chamber to establish a flow rate of 50 to 200 sccm.

7. The method according to claim 3, comprising depositing the second silicon carbide layer at;
   a TMS flow rate of 100 to 200 sccm;
   a He flow rate of 100 to 1,000 sccm; and
   an $NH_3$ flow rate of 200 to 600 sccm.

8. The method according to claim 1, wherein each of the first and second dielectric layers comprises a dielectric material having a dielectric constant (k) no greater than 3.9.

9. The method according to claim 8, wherein the dielectric material has a porosity of about 10% to about 20%.

10. The method according to claim 8, comprising filling the dual damascene opening by:
    depositing a barrier layer lining at the dual damascene opening and on the upper surface of the conductive features; and
    filling the opening with copper (Cu) or a Cu alloy.

11. The method according to claim 10, wherein the barrier comprises tantalum or a composite layer of tantalum nitride and a layer of α-tantalum thereon.

12. A semiconductor device comprising:
    a first dielectric layer over a conductive feature;
    a graded middle-etch stop layer on the first dielectric layer, the graded middle-etch stop layer comprising:
       a first silicon carbide layer on the first dielectric layer;
       a silicon layer on the first silicon carbide layer; and
       a second silicon carbide layer on the silicon layer;
    a second dielectric layer on the graded middle-etch stop layer;
    a dual damascene opening comprising:
       an upper trench section having side surfaces defined by the second dielectric layer and a bottom surface defined by the silicon layer; and
       a lower via hole section having side surfaces defined by the first dielectric layer and a bottom surface defined by an upper surface of the conductive feature; and
    conductive material filling the dual damascene opening.

13. The semiconductor device according to claim 12, wherein:
    each of the first and second silicon carbide layers has a thickness of 250 Å to 350 Å; and
    the silicon layer has a thickness of 20 Å to 50 Å.

14. The semiconductor device according to claim 12, wherein each of the first and second dielectric layers comprises a dielectric material having a dielectric constant (k) no greater than 3.9.

15. The semiconductor device according to claim 14, the dielectric material has a porosity of about 10% to about 20%.

16. The semiconductor device according to claim 14, wherein the conductive material filling the dual damascene opening comprises:
    a barrier layer lining the dual damascene opening and on the upper surface of the conductive feature; and
    copper (Cu) or a Cu alloy filling the dual damascene.

17. The semiconductor device according to claim 16, wherein the barrier layer comprises tantalum or composite comprising a layer of tantalum nitride and a layer of α-tantalum thereon.

* * * * *